United States Patent [19]

Pye

[11] Patent Number: 4,586,001
[45] Date of Patent: Apr. 29, 1986

[54] LOW VOLTAGE PUSH-PULL AMPLIFIER

[75] Inventor: Michael R. Pye, Winchester, England

[73] Assignee: Sinclair Research Ltd., Hampshire, England

[21] Appl. No.: 596,353

[22] Filed: Apr. 3, 1984

[30] Foreign Application Priority Data

Apr. 22, 1983 [GB] United Kingdom ............... 8311072

[51] Int. Cl.⁴ ........................... H03F 3/26; H03F 3/18
[52] U.S. Cl. .................................... 330/267; 330/146; 330/268
[58] Field of Search ............... 330/146, 263, 265, 267, 330/271, 268

[56] References Cited

U.S. PATENT DOCUMENTS 3,363,191 1/1968 Boughtwood et al. ............. 330/263
3,537,023 10/1970 Myer .............................. 330/268 X
4,355,287 10/1982 Hoover ........................... 330/146 X

FOREIGN PATENT DOCUMENTS 2100948 1/1983 United Kingdom ............... 330/265

Primary Examiner—Eugene R. LaRoche
Assistant Examiner—Steven J. Mottola
Attorney, Agent, or Firm—Memel, Jacobs, Pierno, Gersh & Ellsworth

[57] ABSTRACT

A Class B push-pull amplifier designed for use at low supply voltages (e.g. 1 to 2 volts) wherein complementary push-pull output transistors $T_3$, $T_4$ are biased by a biasing chain consisting of resistor $R_1$, transistor $T_1$, resistor $R_2$, transistor $T_2$, resistor $R_3$, with the signal to the bases of $T_3$, $T_4$ being supplied from opposite ends of $R_2$. The value of $R_2$ is twice that of $R_1$ and $R_3$. The circuit is preferably used in a bridge configuration with a second similar amplifier set at unity gain driven from the first amplifier. It may be used to power the loudspeaker of a miniature radio receiver.

28 Claims, 4 Drawing Figures

LOW VOLTAGE PUSH-PULL AMPLIFIER

This invention relates to amplifiers, and particularly push-pull amplifiers arranged to operate in Class B at low supply voltages.

With the desire in the electronics industry for the miniaturisation of components and devices, and the public desire for miniature, but efficient communications devices, an amplifier capable of driving loads such as loudspeakers at low voltages is clearly of interest. We have devised such amplifiers, which are suitable for use with supply voltages of 1 to 2 voltages (typically available from electronic watch batteries) and which use a minimal number of components. The circuit is designed for Class B push-pull operation and therefore is especially suited for use in the output amplifier stage of a miniature radio receiver, or low power hearing aids.

According to the invention we provide a complementary push-pull amplifier comprising:
- a series connection between the power supply rails of first, second and third resistors, the first resistor being connected to the second resistor through the emitter and collector of a first transistor, the second resistor being connected to the third resistor through the emitter and collector of a second transistor, the bases of the first and second transistors being connected together to receive an input signal for amplification;
- a pair of complementary transistors connected in series between the power supply rails with the respective bases receiving signals from opposite ends of the second resistor; and
- means for providing an amplified output from the junction of said complementary transistors.

Preferred features of the invention will now be described with reference to the accompanying drawings, in which.

Figure 1:
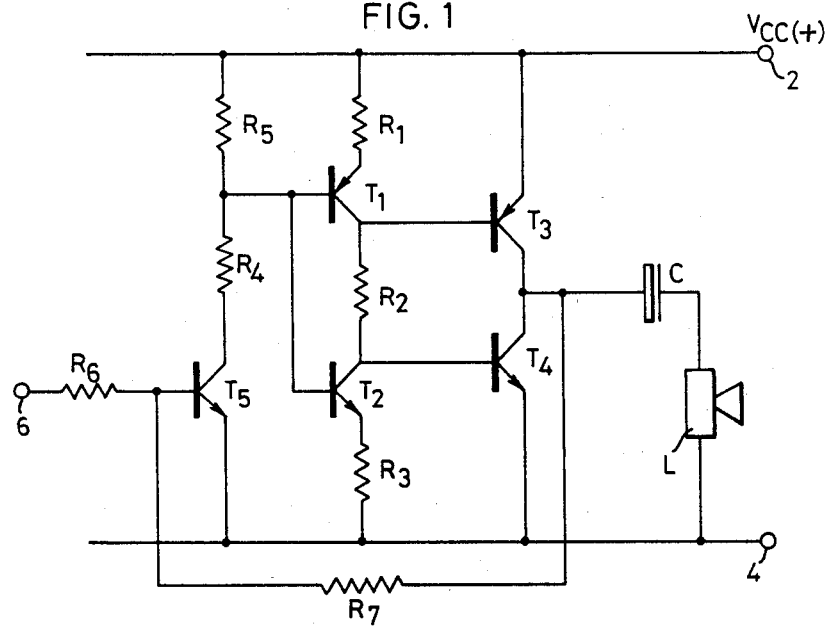
FIG. 1 is a circuit diagram of a preferred amplifier according to the invention.

Referring to FIG. 1, first, second and third resistors $R_1$, $R_2$, and $R_3$ are connected in series between the power supply rails 2 and 4 and interconnected by complementary transistors $T_1$ and $T_2$. A complementary pair of output transistors $T_3$ and $T_4$ have their bases connected to opposite ends of $R_2$. The bases of $T_1$ and $T_2$ are connected together and receive the signal from an input transistor $T_5$. The collector of $T_5$ is biased through resistors $R_4$ and $R_5$, whereas the input to the amplifier, at 6, is through resistor $R_6$ to the base of $T_5$. A feedback from the junction of $T_3$ and $T_4$ is provided through resistor $R_7$ to the base of $T_5$. The amplified output for the circuit is also taken from the junction of $T_3$ and $T_4$, through capacitor C and loudspeaker L.

The circuit is operated with a supply voltage of about 1 to 2 volts and in the Class B mode with silicon bipolar transistors. It has a stable output bias at low voltage. The output quiescent current is adjustable, if required, by trimming the value of $R_2$. Preferably $R_1$ and $R_3$ have substantially the same value and $R_2$ a value substantially twice this. The resistor $R_4$ is included to prevent the circuit latching-up when $T_1$ goes into saturation. the amplifier is particularly useful for low voltage communication equipment, such as miniature radio receivers or hearing aids driven from small low voltage batteries.

Typical values of the components are:
$R_1 = R_3 = 120$ ohms
$R_2 = 240$ ohms
$R_5 = 10K$ ohms
$R_4 = 1K$ ohms
$R_6 = 10K$ ohms
$R_7 = 200K$ ohms
$C = 22$ microfarads The nominal loudspeaker impedance is typically 16 ohms.

The embodiment described was designed to operate with discrete silicon bipolar transistors and with a 1-2 volt supply. The invention also applies however to the use of germanium transistors, whereby a supply voltage of about 0.6 to 1.2 volts may be employed. The invention is applicable to circuits in integrated form as well as to discrete component circuits.

The circuit enables the output transistors $T_3$ and $T_4$ to have a stable and predictable bias current when quiescent. Also, the bias and drive arrangement provided by $T_1$ and $T_2$ with $R_1$, $R_2$ and $R_3$ permits the output voltage at the collectors of $T_3$ and $T_4$ to swing the entire supply voltage less the saturation voltages of $T_3$ and $T_4$. This is of especial advantage since normal complementary Class B push-pull amplifiers using silicon transistors do not permit operation at about 1 volt and allow large output voltage swings.

Figure 2:
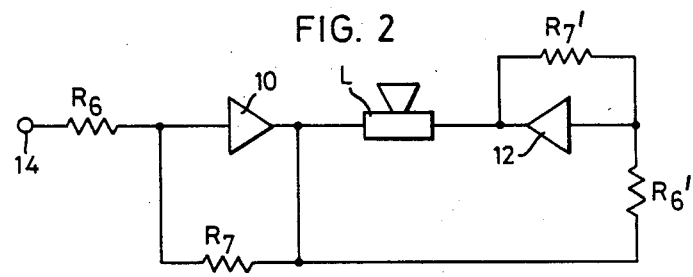
FIG. 2 is a circuit diagram showing a preferred configuration for the amplifier of FIG. 1.

In a preferred mode of operation, the circuit is employed in a bridge configuration as shown in FIG. 2. Referring to the latter a pair of amplifier circuits as just described with reference to FIG. 1 are illustrated generally at 10 and 12 and with their corresponding input resistors $R_6$ and $R_6'$, respectively, and feedback resistors $R_7$ and $R_7'$ respectively. Signal input is applied to $R_6$ at 14 and the output of the first amplifier 10 employed to drive the second amplifier 12 through $R_6'$. The gain of the second amplifier is set to unity and therefore, typically:

$R_6' = R_7'$
$R_7 = 50R_6$

The bridge configuration is particularly useful for obtaining increased output powers at low voltage without the use of low impedance loads and large value low dissipation factor output capacitors. The elimination of the output capacitor gives both a cost and size factor saving.

Figure 3:
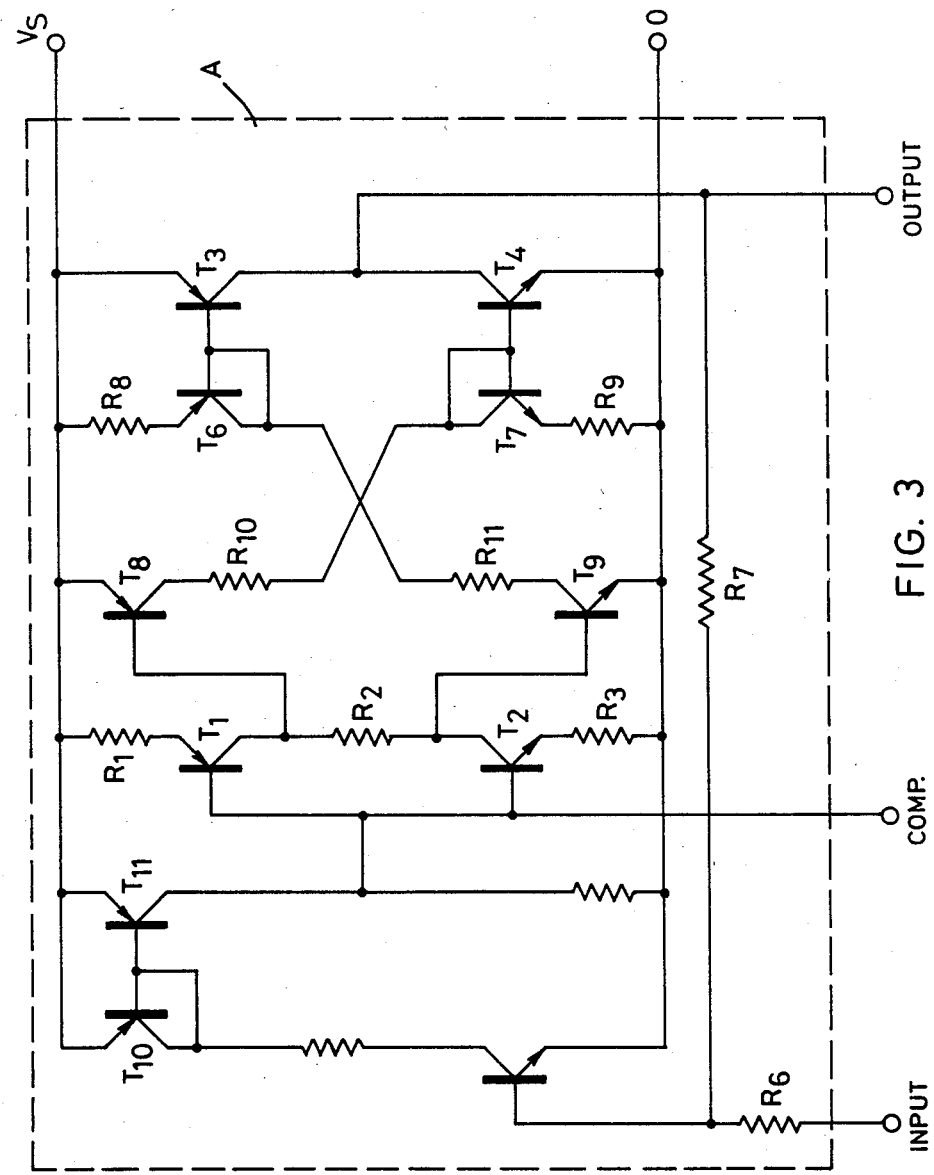
FIGS. 3 and 4 are similar to FIGS. 1 and 2, but show an integrated circuit implementation of the invention.
Figure 4:
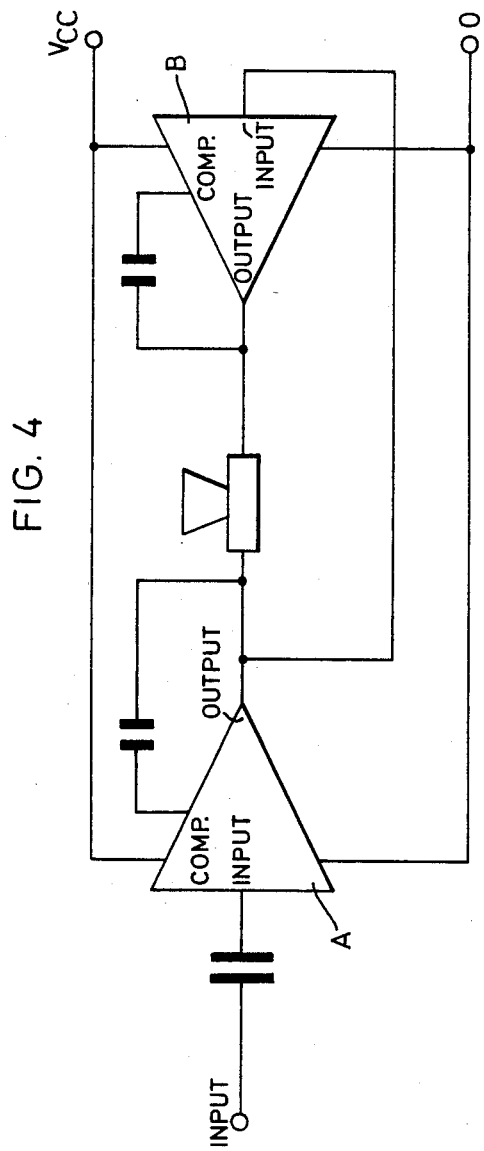

A silicon integrated circuit implementation of the invention is shown in FIGS. 3 and 4. Referring to FIG. 3, transistors and resistors having the same functions (but not necessarily the same values) as the FIGS. 1 and 2 embodiment are similarly numbered. Thus, the biasing chain $R_1$, $T_1$, $R_2$, $T_2$, $R_3$ supplies push-pull output transistors $T_3$ and $T_4$. The latter are in the form of current mirrors with $T_6$ and $T_7$, respectively, to provide a defined current gain. A preferred mirror ratio $T_6:T_3$; $T_7:T_4$ is about 10:1. An additional drive stage $T_8$, $T_9$ is employed to provide adequate overall current gain. The use of current mirrors plus an additional drive stage compensates for the somewhat inferior current gain performance of integrated pnp devices, particularly at high currents.

The resistors $R_8$, $R_9$ allow effective gain boost at high drive levels whereas resistors $R_{10}$, $R_{11}$ limit the drive current available to the current mirrors.

Because of the additional driver stage a phase reversal occurs which is recovered on feedback by the use of an additional phase inverter in the form of a further current mirror $T_{10}$, $T_{11}$ typically with a ratio of about 1:5.

The amplifier A, within the dashed lines as shown may be used as a single-ended integrated amplifier with suitable A.C. coupling components to its input, A.C. compensation ("comp"), and output connections. Preferably however it is employed in a manner similar to that shown in FIG. 2—as a bridge amplifier in conjunction with a second, similar amplifier B, operated at unity gain and driven from the output of amplifier A. Such an arrangement is illustrated in FIG. 4. Both amplifiers A and B may be disposed on a single integrated circuit.

I claim:

1. A complementary push-pull amplifier comprising: a series connection between the power supply rails of first, second and third resistors, the first resistor being connected to the second resistor through the emitter and collector of a first transistor, the second resistor being connected to the third resistor through the emitter and collector of a second transistor, the bases of the first and second transistors being connected together to receive an input signal for amplification;
    a pair of complementary transistors connected in series between the power supply rails with the respective bases receiving signals from opposite ends of the second resistor and the respective collectors being connected together at the junction between said complementary transistors; and
    means for providing an amplified output from said junction of said complementary transistors.

2. An amplifier according to claim 1 wherein the second resistor is substantially twice the value of the first resistor, which is substantially the value of the third resistor.

3. An amplifier according to claim 1 or 2 wherein a feedback is provided from the junction of said complementary transistors to a position more adjacent the input of the amplifier.

4. An amplifier according to claim 1 or 2 comprising means to enable an input signal for amplification to be supplied to the base of a further transistor, the output from which is supplied to the said base connection of first and second transistors.

5. An amplifier according to claim 1 or 2 wherein each transistor of said complementary pair of transistors forms a part of a respective current mirror.

6. An amplifier according to claim 5 which comprises a driver transistor stage interposed between said second resistor and said current mirrors.

7. An amplifier according to claim 1 or 2 wherein the first and second transistors are complimentary in type.

8. A circuit as claimed in claims 1 or 2 in combination with a loudspeaker load arranged to receive the amplified output.

9. An amplifier according to claim 3 comprising means to enable an input signal for amplification to be supplied to the base of a further transistor, the output from which is supplied to the base connection of said first and second transistors.

10. An amplifier according to claim 3 wherein each transistor of said complementary pair of transistors forms a part of a respective current mirror.

11. An amplifier according to claim 4 wherein each transistor of said complementary pair of transistors forms a part of a respective current mirror.

12. An amplifier according to claim 3 wherein the first and second transistors are complementary in type.

13. An amplifier according to claim 4 wherein the first and second transistors are complementary in type.

14. An amplifier according to claim 5 wherein the first and second transistors are complementary in type.

15. A circuit as claimed in claim 3 in combination with a loudspeaker load arranged to receive the amplified output.

16. A circuit as claimed in claim 4 in combination with a loudspeaker load arranged to receive the amplified output.

17. A circuit as claimed in claim 5 in combination with a loudspeaker load arranged to receive the amplified output.

18. A circuit as claimed in claim 7 in combination with a loudspeaker load arranged to receive the amplified output.

19. An amplifier according to claim 6 wherein the first and second transistors are complimentary in type.

20. A circuit as claimed in claim 6 in combination with a loudspeaker load arranged to receive the amplified output.

21. A pair of amplifiers, each amplifier of said pair of amplifiers being a push-pull amplifier having a series connection between the power supply rails of said push-pull amplifier of first second and third resistors, the first resistor being connected to the second resistor through the emitter and collector of a first transistor, the second resistor being connected to the third resistor through the emitter and collector of a second transistor, the bases of the first and second transistors being connected together to receive an input signal for amplification, and means for providing an amplified output from a junction of a pair of complementary transistors; said pair of complementary transistors connected in series between the power supply rails with the respective bases receiving signals from opposite ends of the second resistor and the respective collectors being connected together at the junction between said complementary transistors;
    said pair of amplifiers arranged in relation to a common load in a bridge configuration, one amplifier being arranged to receive a signal for amplification and to provide the signal to drive the second amplifier, one of said amplifiers being of substantially unity again.

22. A pair of amplifiers as claimed in claim 21 for which each of said push-pull amplifiers has said second resistor substantially twice the value of said first resistor, which is substantially the value of said third resistor.

23. A pair of amplifiers according to claim 21 or 22 for which each of said push-pull amplifiers has a feedback provided from the junction of said complementary transistors to a position adjacent the input of each push-pull amplifier.

24. A pair of amplifiers according to claim 21 or 22 for which each of said push-pull amplifiers includes means to enable an input signal for amplification to be supplied to the base of a transistor, the output from which is supplied to the base connection of said first and second transistors.

25. A pair of amplifiers according to claim 21 or 22 for which each of said push-pull amplifiers has each transistor of said complementary pair of transistors arranged as a part of a respective current mirror.

26. A pair of amplifiers according to claim 25 for which each of said push-pull amplifiers includes a driver transistor stage interposed between said second resistor and said current mirrors.

27. A pair of amplifiers according to claim 21 or 22 wherein said first and second transistors are complementary in type for each of said push-pull amplifiers.

28. A pair of amplifiers according to claim 24 wherein said first and second transistors are complimentary in type for each of said push-pull amplifiers.

* * * * *